United States Patent [19]

Baird

[11] 3,766,440

[45] Oct. 16, 1973

[54] CERAMIC INTEGRATED CIRCUIT CONVECTOR ASSEMBLY

[75] Inventor: David M. Baird, Kokomo, Ind.

[73] Assignee: General Motors Corporation, Detroit, Mich.

[22] Filed: Aug. 11, 1972

[21] Appl. No.: 280,067

[52] U.S. Cl. .............................. 317/100, 317/101 A
[51] Int. Cl. .............................................. H02b 1/00
[58] Field of Search ......................... 317/100, 101 A; 174/DIG. 5

[56] References Cited

UNITED STATES PATENTS 3,404,215 10/1968 Burks et al. ...................... 317/101 A
3,694,699 9/1972 Snyder et al. .................. 174/DIG. 5

OTHER PUBLICATIONS

Coles, R. E., "Heat Sink," IBM Tech. Disc. Bull., Vol. 6, No. 2, July, 1963, p. 1.

*Primary Examiner*—David Smith, Jr.
*Attorney*—George A. Grove et al.

[57] ABSTRACT

An integrated circuit assembly which includes a ceramic substrate for thick film power circuits having a cermet circuit pattern and semiconductor dies on one generally flat face and a convector surface configuration on the opposite face.

2 Claims, 3 Drawing Figures

CERAMIC INTEGRATED CIRCUIT CONVECTOR ASSEMBLY

BACKGROUND OF THE INVENTION

This invention relates to integrated circuit devices and more particularly to an integrated circuit assembly having an integral ceramic substrate and convector.

Some integrated circuit devices are made with a ceramic substrate having a thick film, or cermet, circuit pattern and one or more semiconductor dies appropriately attached to portions of the circuit pattern. Such integrated circuits can be referred to as hybrid integrated circuits, and are of particular interest in power circuit applications. The semiconductor dies in such circuits are mounted directly on the circuit pattern in good intimate heat transfer relationship with the ceramic substrate. The ceramic substrate is, in turn, placed in good heat transfer relationship with a heat removal means, such as a heat sink, an air cooled convector assembly, or a liquid cooled assembly.

A problem arises, however, in getting effective heat transfer between the ceramic substrate and the heat removal means, especially if the heat removal means is a convector. Moreover, problems arise due to differences in thermal expansion characteristics between the ceramic substrate and the convector. One can avoid these problems by securing the substrate to an intermediate thermal expansion compensating element, and in turn securing the intermediate element to the convector. This is especially important with large area ceramic substrates.

Certain ceramics such as alumina and beryllia have higher heat conduction properties than others. However, even these ceramics have a lower thermal conductivity than most metals. Hence, the ceramic substrate is normally made quite thin, about 0.025 – 0.035 inch, to reduce heat flow resistance to the convector. However, such thin ceramic structures are easily broken and must be treated quite carefully to avoid breakage not only during processing but also after mounting.

Hence, thin ceramic substrates have been needed but present particular ancillary problems. Special mounting techniques have been developed for them that are both complex and expensive. The mounting techniques involve multilayer structures, which inherently have a greater probability of yield loss in processing and failure during use than a unitary structure.

A typical technique currently used involves bonding the ceramic substrate to an aluminum mounting plate using a heat conductive resin, such as a metal filled epoxy resin. The aluminum mounting plate is, in turn, bolted or clamped to a metal convector assembly. Unfortunately, even the commercially avilable metal filled epoxy resins unduly limit heat transfer between the substrate and the aluminum plate. While other techniques for mounting the ceramic substrate to the convector can be used, such as metallizing the substrate and soldering it to the aluminum, such techniques are not practical. In general these latter techniques present thermal expansion problems, due to differences in thermal expansion coefficients for the materials used. Hence, these other techniques do not provide a very feasible alternative to adhesively bonding the substrate to a carrier.

On the other hand, I have found that with certain ceramics one can directly convect as much heat away from the backside of the substrate as he can conduct away in the more conventionally mounted multilayer assemblies, without the attendant problems.

OBJECTS AND SUMMARY OF THE INVENTION

It is, therefore, a principal object of this invention to provide a novel hybrid integrated circuit assembly having a unitary substrate and convector made of a high thermal conductivity ceramic.

The invention comprehends an assembly having a thick plate-like ceramic element with a flat face upon which the cermet circuit pattern and semiconductor elements are disposed. The opposite face or backside of the ceramic element is highly contoured so as to increase its area and provide a plurality of integral heat radiating fins. The ceramic element is made thick enough to be self-supporting and mountable in any convenient fashion such as by bolting, clamping or the like.

BRIEF DESCRIPTION OF THE DRAWING

Other objects, features and advantages of the invention will become more apparent from the following desciption of the preferred embodiments thereof and from the drawings, in which.

DESCRIPTION OF THE PREFERRED EMBODIMENTS

Figure 1:
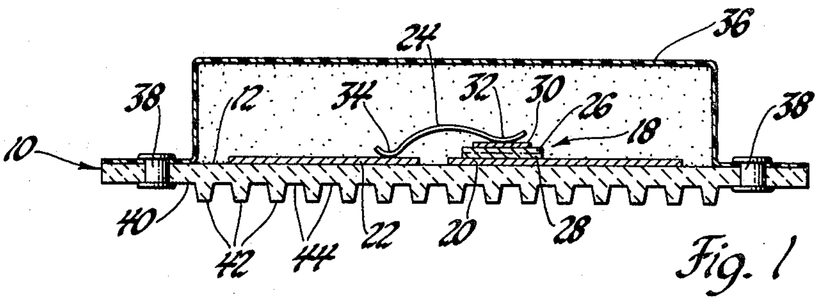
FIG. 1 shows a cross-sectional view along the line 1—1 of FIG. 2.
Figure 2:
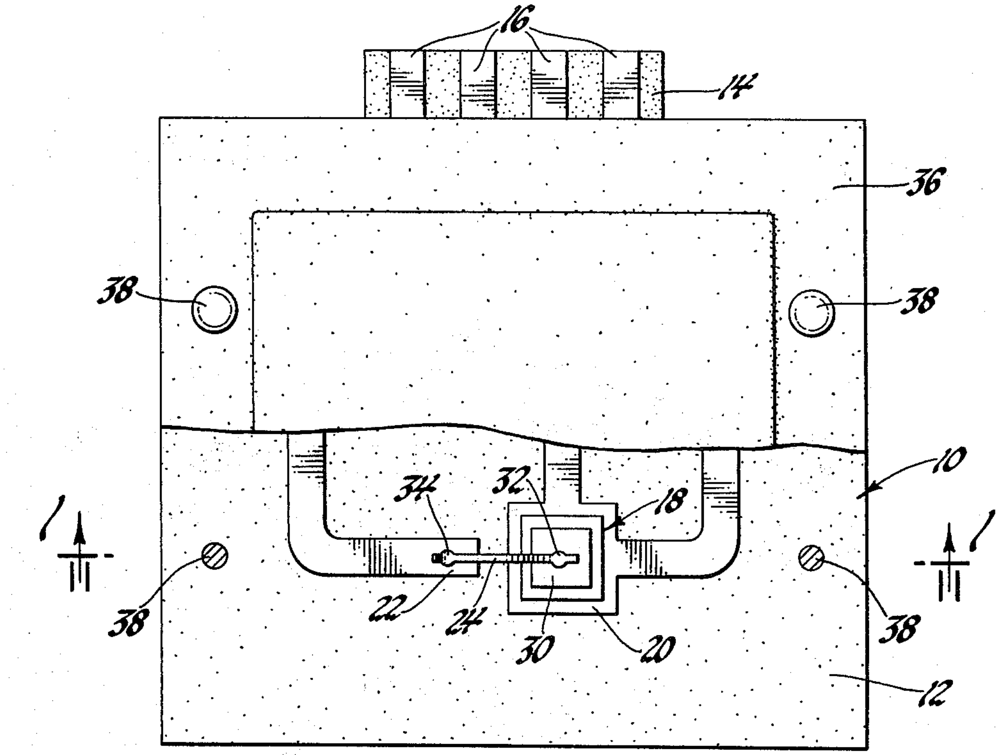
FIG. 2 shows a plan view with parts broken away of an integrated circuit assembly made in accordance with the invention.
Figure 3:
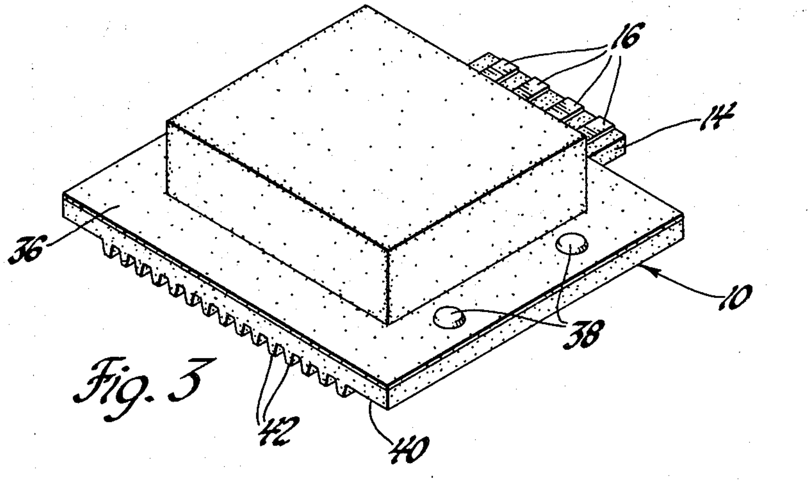
FIG. 3 shows an isometric elevational view of the device shown in FIGS. 1 and 2.

In its preferred form the invention would involve a broad area ceramic element 10 with a cermet circuit pattern on one flat face 12. The ceramic element 10 is a generally platelike member in that its maximum length and width are at least 10 times its maximum thickness, and preferably at least 20 times its maximum thickness. Ceramic element 10 is made of a high thermal conductivity dielectric such as alumina, beryllia, and mixtures thereof. By the terms alumina and beryllia, I mean to include ceramics containing at least 90 percent by weight aluminum oxide and beryllium oxide, respectively.

The circuit pattern on flat surface 12 of the ceramic element includes conductors, resistors and power semiconductor chips, only part of which are shown. The circuit pattern is a printed pattern formed by silk screening in the usual way. For example, it can be produced by silk screening successive partially overlapping patterns of conductor and resistor compositions onto surface 12 of the ceramic element 10. The conductor and resistor compositions are viscous mixtures which include conductor or resistor particles, particles of a low melting point temperature glass, and a liquid vehicle such as an organic resin. The compositions are printed and dried in successive steps. After all printing has been accomplished, the ceramic element 10 is fired to fuse the glass particles to the ceramic and burn out the resin. If desired, specially printed gold cermet areas can be provided to facilitate mounting semiconductor dies and interconnecting them into the circuit pattern.

In plan view ceramic element 10 is a generally rectangular substrate having a small projecting portion 14 on which extensions 16 of the circuit pattern have been printed to serve as terminal connection points for the circuit pattern. In such a construction extensions 16 can be used as contacts for a connecting plug for the circuit pattern. On the other hand, wire connectors can be soldered to these extensions, if desired, for a more permanent connection to the circuit.

A semiconductor die 18 is mounted on one portion 20 of the circuit pattern and connected to an adjacent portion 22 of the circuit pattern by means of a connecting wire 24. The semiconductor die 18 can be a discrete device chip, such as a diode chip having a P-type region 26 and an N-type region 28. The upper surface of semiconductor die 18 has a metallized contact 30. Gold wire 24 is connected at 32 to contact 30 and at 34 to portion 22 of the circuit pattern. Wire 24 can be attached by thermocompression bonding, ultrasonic bonding, or the like.

Other semiconductor dies, not shown, can also be included in the circuit if desired. Also, semiconductor die 18, as well as the other dies referred to can be a monolithic integrated circuit chip instead of a discrete device chip, having a plurality of devices formed therein and interconnected by a metallization pattern on the chip. Of course, for a monolithic integrated circuit chip additional interconnections with the circuit pattern must be provided.

The semiconductor die 18 is preferably mounted directly on the circuit pattern with its lower face directly in contact with the pattern and its upper surface wire bonded into the circuit pattern. In this way the die is effectively in direct contact with the ceramic substrate 10 for best heat transfer. However, it is also contemplated that the semiconductor die could have integral leads, such as contact bumps or beam leads, which could be used to interconnect the die into the circuit pattern. However, the latter type of interconnection does not provide the fullest benefits obtainable with this invention.

A plastic or ceramic cover element 36 is attached by rivets 38 to the substrate. The cover, of course, should be of a nonconductive material or, if of a conductive material, insulated from circuit extensions 16. It can be attached in any convenient manner, as by adhesives, glass bonding, bolting, etc. The strength of the ceramic element 10 in my invention is sufficient to accommodate mechanically fastening the cover. The preferred ceramic material should have a flexural breaking strength at least about 40,000 pounds per square inch. On the other hand, one may not choose to even use a discrete cover element. One may prefer to simply cover the circuit with a coating or molding composition, such as room temperature vulcanizable rubber, epoxy, or the like.

The lower face 40 of element 10, the face opposite flat face 12 on which the circuit pattern is disposed, is contoured to increase heat radiation from that surface. For this reason a group of parallel heat radiating fins 42 are provided in the lower surface 40. The fins can be provided in the circuit board as originally produced, such as by molding or the like. However, I have found that best results are obtainable by initially starting with a thick sheet of ceramic that is flat on both sides. I then lap it to the desired thickness, parallelism and surface finish. After lapping, the fins can be accurately formed by machining one of the lapped flat faces of the sheet. The machining is done in the normal and accepted manner for machining ceramics.

The minimum thickness of the ceramic element 10 lies between surface 12 and the base surface 44 from which the fins extend. This thickness should be at least about 0.06 inch, in order to insure that the circuit board has sufficient strength to be self-supporting and directly mountable by mechanical fastening techniques. It must be thick enough to resist fracture during manufacturing and assembly but also after mounting for use.

On the other hand, minimum thicknesses greater than about 0.1 inch are to be avoided. Even the most highly heat conductive ceramics have relatively low heat transfer characteristics compared to metal. Minimum thicknesses above about 0.1 inch provide an unduly long heat flow path to fins 42. Accordingly, I prefer a minimum thickness of about 0.06 – 0.1 inch.

Convector fins 42 on the other hand should provide a surface area that is at least four times that of surface 12 per planar unit area. Many low profile fins are preferred rather than a few high profile fins. The low profile fins are more resistant to breakage. Moreover, they are more effective in radiating heat, since the heat flow path to their extremities is shorter. In this connection it is desirable that the heat radiating fins not project beyond surface 34 more than about 0.1 – 0.2 inch. Effective heat radiation area can be provided with fins 42 being tapered and having a root width of about 0.06 –0.09 inch and tapering to a width of about 0.03 – 0.06 inch at the outer extremity. It is to be noted that for ease of mounting the device the fins 42 extend only under part of the rectangular periphery of substrate 10 and not under the projecting portion 14.

Although this invention has been described in connection with certain specific embodiments thereof, no limitation is intended thereby except as defined in the appended claims.

I claim:

1. A hybrid integrated circuit assembly having an integral ceramic substrate and convector, said assembly comprising a substrate of a ceramic selected from the group consisting of alumina and berylia, said substrate having one substantially flat surface and a highly contoured opposite surface for heat radiation from said substrate, the minimum thickness of said substrate between said surfaces being about 0.06 – 0.1 inch, a cermet circuit pattern on said flat surface, at least one semiconductor die mount region in said circuit pattern, at least one semiconductor die attached to said circuit pattern in said region, said highly contoured opposite surface of said substrate having integral projections thereon that provide an actual surface area per unit planar area at least four times the unit planar area, said integral projections having a root width of 0.6 – 0.9 inch, a protective covering secured to said substrate over said pattern and said die, and conductive leads from said circuit pattern extending out from said covering.

2. The assembly as described in claim 1 wherein the substrate is of alumina, the integral projections on said contoured opposite substrate surface are mutually parallel linear fins, and said fins project out from said opposite surface less than about 0.2 inch.

* * * * *